United States Patent [19]

Bloomer

[11] Patent Number: 4,500,838

[45] Date of Patent: Feb. 19, 1985

[54] CURRENT SENSOR

[75] Inventor: Milton D. Bloomer, Scotia, N.Y.

[73] Assignee: General Electric Company, Schenectady, N.Y.

[21] Appl. No.: 460,427

[22] Filed: Jan. 24, 1983

[51] Int. Cl.³ .............................................. G01R 33/00
[52] U.S. Cl. ................................ 324/117 R; 310/328; 324/109; 324/457
[58] Field of Search .................. 73/DIG. 4; 310/328; 324/117 R, 109, 72, 457, 458

[56] References Cited

U.S. PATENT DOCUMENTS 3,997,839  12/1976  Dreyfus et al. ..................... 324/72.5

FOREIGN PATENT DOCUMENTS 2409519  7/1979  France ................................ 324/109
52-16628  8/1977  Japan .................................. 324/109

OTHER PUBLICATIONS

R. R. Williams et al., "Measurement of Fast Risetime Megamphere Currents by Quartz Gauge", at 14*th Pulse Power Modulator Symposium,* IEEE, Jun. 3-5, 1980, Florida.

Primary Examiner—Stewart J. Levy
Attorney, Agent, or Firm—Geoffrey H. Krauss; James C. Davis, Jr.; Marvin Snyder

[57] ABSTRACT

A current sensor, responsive to the first power of a current to be measured, utilizes a piezoelectric element located between a current-carrying conductor and a permanent magnet having its north-south poles aligned normal to the direction of current flow through the conductor. The substantially constant magnetic field provides a sensor output, taken from electrodes upon opposite surfaces of the piezoelectric member, which is proportional to the first power of current flowing in the single conductor.

12 Claims, 2 Drawing Figures

CURRENT SENSOR

BACKGROUND OF THE INVENTION

The present application relates to current sensors and, more particularly, to a novel current sensor utilizing a piezoelectric element and having an output proportional to the first power of a current to be measured.

It is well known to sense the magnitude of a flowing current by means of a current shunt or a current transformer, both of which components are relatively expensive, relatively bulky and which are not integratable with any associated electronic circuitry. An integratable current sensor 10 has been described and claimed in copending application Ser. No. 432,207, filed Oct. 1, 1982, by Henry A.F. Rocha, assigned to the assignee of the present application and incorporated herein by reference in its entirety. In this sensor (see FIG. 1), a piezoelectric member 11 is provided with electrodes 12a and 12b on the opposed surfaces thereof. Electrodes 12a and 12b are respectively coupled to lead conductors 14a and 14b for providing a sensor output voltage. The electrodes 12a and 12b are respectively in abutment with first and second insulative layers 16a and 16b, serving to insulatively position the electrode-supporting piezoelectric member 11 between a pair of conductors 16a and 16b carrying an identical current I in the same direction relative to the piezoelectric element. The conductors 18a and 18b may be supported by insulative means 20 and the entire conductor-insulator-piezoelectric element assembly may be fabricated upon a supportive substrate 22. Sensor 10 provides an output voltage, between leads 14a and 14b, responsive to the magnitude of the compressive force acting upon piezoelectric element 11, which force is proportional to the product of the currents flowing in the same direction in conductors 18a and 18b. By connecting conductors 18a and 18b such that the same current flows through both conductors, the sensor is proportional to the square of the current I. While it may be desirable, in certain instances, to have a sensor output proportional to the square of the sensed current, it is highly desirable to provide a sensor which is responsive to the first power of the current, i.e. a sensor having an output voltage $V=kI$, where k is a proportionality constant. Further, because the piezoelectric element 20 supports some of the uniform force between conductors 18 and insulators 16 support the balance of the forces, only a fraction of the total force is supported by the piezoelectric element 20, and that fraction depends upon the relative compliance of the piezoelectric element, the conductors and the insulators. Thus, the output is a function of the sensor geometry, which is affected by the temperature to which the sensor is subjected. It is further desirable to provide a sensor having an output variability less subject to temperature and geometry considerations.

BRIEF DESCRIPTION OF THE INVENTION

In accordance with the invention, a current sensor utilizes a piezoelectric element having electrodes fabricated upon opposite surfaces thereof, with a first electrode being insulatively spaced from a single current-carrying conductor, and with the remaining electrode being substantially in abutment with a permanent magnet. The poles of the permanent magnet are aligned substantially normal to the direction of current flowing through the underlying conductor.

In a presently preferred embodiment, an insulative member is placed between the piezoelectric element electrode and the current-carrying conductor, with the remaining surface of the conductor being supported by an insulative substrate. Alternatively, the substrate may support the piezoelectric element, with the conductor being placed upon the opposite side of the substrate from the piezoelectric element-magnet structure.

Accordingly, it is an object of the present invention to provide a novel current sensor utilizing a piezoelectric element and responsive to the first power of the current sensed by such sensor.

This and other objects of the present invention will become apparent to those skilled in the art upon consideration of the following detailed description, when read in conjunction with the drawings.

DETAILED DESCRIPTION OF THE INVENTION

Figure 1:
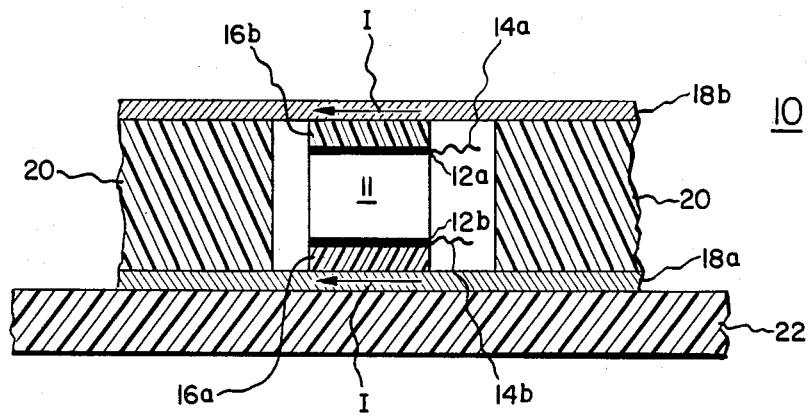
FIG. 1 is a sectional side view of a prior art current sensor, having an output voltage proportional to the square of the current to be measured.
Figure 2:
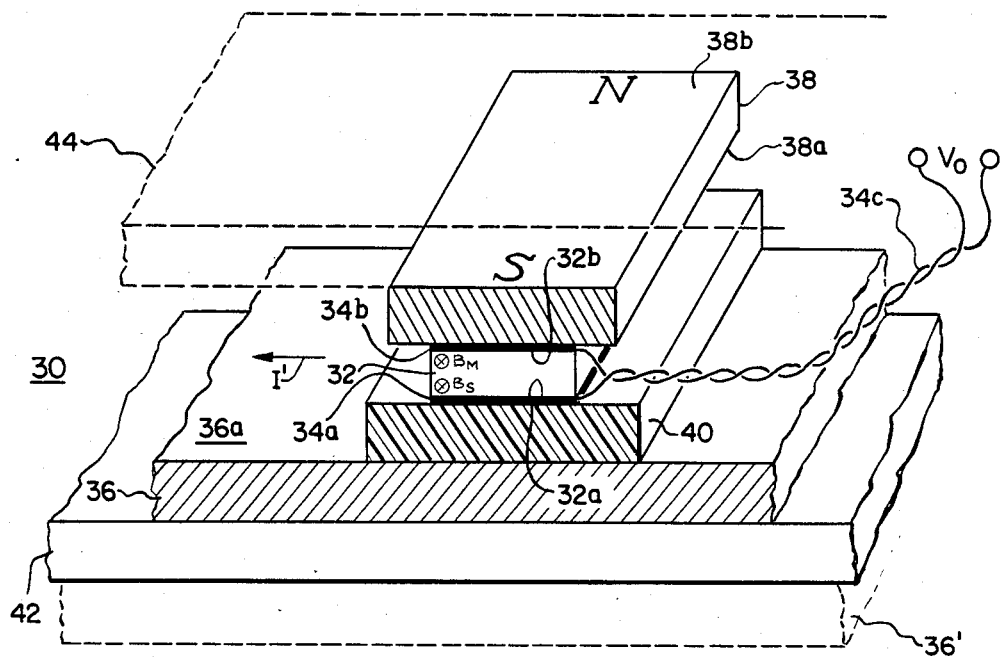
FIG. 2 is a sectional perspective view of a current sensor in accordance with the principles of the present invention.

Referring to FIG. 2, my novel piezoelectric current sensor 30, having an output voltage proportional to the first power of a current I' to be measured, utilizes a piezoelectric sensing element 32. First and second electrodes 34a and 34b are fabricated upon opposite surfaces of the piezoelectric element 32. Specifically, electrodes 34a and 34b are fabricated upon the pair of substantially parallel planar sensing element surfaces 32a and 32b which are parallel to the surface 36a of a conductor 36 and to the planar surface 38a of a magnetic member 38. Lead means 34c are provided for connection of electrodes 34a and 34b to a location selected to allow the sensor output voltage $V_o$ to be obtained. An insulative member 40 is positioned between the conductive electrode 34a and conductor 36. Permanent magnetic member 38 is placed substantially in abutment with second electrode 34b, and is so positioned such that the North and South poles thereof are aligned essentially normal to the direction of current flow, as indicated by arrow I', through conductor 36. The magnet-piezoelectric element-insulator-conductor sandwich may be supported by a suitable insulative substrate 42. Additional insulative material 44 may be utilized in abutment with the remaining magnetic member surface 38b for maintaining mechanical integrity of the sensor 30. Alternatively, insulative member 40 may be dispensed with, and the first sensor element electrode 34a placed directly upon insulative substrate 42, whereupon the conductor 36' is positioned upon the opposite surface of the substrate from the magnet-piezoelectric element combination.

In operation, the magnetic field $B_M$ of the magnet extends through the piezoelectric member, as does the magnetic field $B_S$ responsive to the flow of conductor current I'. For a current flow in the indicated direction (leftwardly), the magnetic fields flow in the same direction and cause a constriction of the piezoelectric element. Conversely, for a flow of current in the opposite direction, i.e. against the direction of arrow I', the magnetic field $B_S$ would reverse in direction and an extension force, rather than the constrictive force, would act upon the piezoelectric element. In either case, the force on element 32 causes an output voltage $V_0$ to be generated. This output voltage is responsive to the product of the magnetic field of magnet member 38 and the current I', or $V = aB_M I'$, where a is a proportionality constant dependent upon the geometry, spacings and the like physical parameters, of the sensor 30. As a permanent magnet member 38 is used, the magnetic field $B_M$ thereof is substantially constant in a particular sensor configuration, whereby $V_O = kI'$, where $k = aB_M$ is another constant. Thus, the sensor output voltage is proportional to the first power of the sensed current I'.

While one presently preferred embodiment of my novel piezoelectric current sensor is described in detail herein, many modifications and variations will now become apparent to those skilled in the art. It is my intent, therefore, to be limited only by the scope of the appending claims and not by way of the specific details and instrumentalities presented by way of description of the preferred embodiment herein.

What is claimed is:

1. A sensor having an output responsive to the first power of a sensed current, comprising:
    a piezoelectric element having first and second opposed surfaces;
    first and second electrodes fabricated upon said piezoelectric element first and second surfaces, said sensor output being provided between said first and second electrodes;
    conductor means positioned adjacent to one piezoelectric element surface for carrying a current to be measured therepast; and
    a permanent magnet member positioned adjacent to the remaining surface of the piezoelectric element and having the north-south poles thereof aligned normal to the direction of current flow in said conductor means.

2. The sensor of claim 1, further comprising a layer of insulative material interposed between said conductor and the electrode-bearing piezoelectric element surface closest thereto.

3. The sensor of claim 2, wherein said insulative layer is a substantially rigid substrate.

4. The sensor of claim 2, further comprising a substrate supporting said conductor upon the opposite side thereof from said piezoelectric element.

5. The sensor of claim 4, wherein said substrate is positioned between said insulative layer and said conductor.

6. The sensor of claim 1, further comprising an insulative substrate interposed between said conductor and the electrode-bearing piezoelectric element surface closest thereto.

7. The sensor of claim 6, wherein said substrate is substantially rigid.

8. The sensor of claim 1, further comprising cover means at least adjacent to said magnet member for protectively enclosing at least a portion of said sensor.

9. The sensor of claim 1, wherein said electrodes are substantially planar and substantially parallel to one another.

10. The sensor of claim 9, wherein said conductor means is a conductive member having a substantially planar surface substantially parallel to the plane of the adjacent electrode.

11. The sensor of claim 10, wherein said magnet member provides a substantially constant magnetic field substantially parallel to said electrodes.

12. The sensor of claim 1, further comprising lead means connected to said electrodes for providing the sensor output.

* * * * *